US012592168B2

(12) United States Patent
Sun

(10) Patent No.: US 12,592,168 B2
(45) Date of Patent: Mar. 31, 2026

(54) SPLICING SCREEN AND DISPLAY DEVICE

(71) Applicant: TCL CHINA STAR OPTOELECTRONICS TECHNOLOGY CO., LTD., Shenzhen (CN)

(72) Inventor: Bo Sun, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 746 days.

(21) Appl. No.: 17/822,782

(22) Filed: Aug. 27, 2022

(65) Prior Publication Data

US 2024/0029594 A1     Jan. 25, 2024

(30) Foreign Application Priority Data

Jul. 20, 2022     (CN) .......................... 202210872415.2

(51) Int. Cl.
*G09F 9/302* (2006.01)
*G09F 9/33* (2006.01)
(Continued)

(52) U.S. Cl.
CPC .............. *G09F 9/3026* (2013.01); *G09F 9/33* (2013.01); *H01L 25/0753* (2013.01); *H10H 20/84* (2025.01)

(58) Field of Classification Search
CPC ......... G09F 9/3026; G09F 9/33; H10H 20/84; H01L 25/0753
See application file for complete search history.

(56) References Cited

U.S. PATENT DOCUMENTS

2016/0267860 A1*  9/2016  Liu ........................... G09G 3/32
2020/0209658 A1*  7/2020  Xiao ................. G02F 1/133514

FOREIGN PATENT DOCUMENTS

CN          111653207      *    9/2020
CN          111653207  A       9/2020
(Continued)

OTHER PUBLICATIONS

Chinese Office Action issued in corresponding Chinese Patent Application No. 202210872415.2 dated Mar. 31, 2023, pp. 1-4.
(Continued)

*Primary Examiner* — Mary Ellen Bowman
(74) *Attorney, Agent, or Firm* — PV IP PC; Peter Stecher; Wei Te Chung

(57) ABSTRACT

The present application provides a splicing screen and a display device. The display screen comprises at least a first display panel and a second display panel of a same type, and a third display panel with a type different from that of the first display panel and sandwiched between the first display panel and the second display panel. Each of the first display panel and the second display panel comprises the first light emitting module. The third display panel comprises a plurality of second light emitting modules. A color gamut adjustment module is disposed on at least one of the second light emitting modules such that a color gamut of the third light emitting module is the same as a color gamut of the first light emitting module to further make light emitted by the first display panel, the second display panel, and the third display panel similar.

8 Claims, 10 Drawing Sheets

(51) Int. Cl.
     *H01L 25/075*          (2006.01)
     *H10H 20/84*           (2025.01)

(56)                References Cited

FOREIGN PATENT DOCUMENTS

| | | | | |
|---|---|---|---|---|
| CN | 114068505 | * | 2/2022 |
| CN | 114068505 | A | 2/2022 |
| WO | 2019168187 | A1 | 9/2019 |

OTHER PUBLICATIONS

Chinese Decision of Rejection issued in corresponding Chinese Patent Application No. 202210872415.2 dated May 25, 2023, pp. 1-6.

* cited by examiner 10  30  20

302 {
311
310

301

110    320    20

10          320          210

SPLICING SCREEN AND DISPLAY DEVICE

FIELD OF INVENTION

The present application relates to a field of display technologies, especially to a splicing screen and a display device.

BACKGROUND OF INVENTION

Under a perquisition of no increase of a size of a glass substrate, a greater size needs to be achieved by a splicing method. During actual production and research, it is discovered that because of space limits of frame sealant, glass cutting tolerance, and outer periphery wiring, splicing locations has clear splicing slits, which tremendously affects a display effect of a final product.

In the conventional technology, usually a plurality of display screens are spliced, and other display screens are disposed in splicing slits among the display screens to eliminate the slits. During display, the display screens in a normal display region display normally, and the display screens in the splicing slits directly display to emit light. Through adjustment, screen images of the display screen of two types can compensate to achieve none-patchwork display. However, in the conventional splicing screen, a color gamut of the display screens in the normal display regions is greatly different from a color gamut of the display screens at the splicing slits and results in a poor screen image display effect.

SUMMARY OF INVENTION

The present application provides a splicing screen and a display device to solve an issue of uneven screen images of splicing slits in the conventional splicing screen affecting display.

In a first aspect, the embodiment of the present application provides a splicing screen, the splicing screen comprises a first display panel, a second display panel, and a third display panel, the first display panel and the second display panel are same type display panels, the first display panel and the third display panel are different types, the third display panel is sandwiched between the first display panel and the second display panel;

the first display panel comprises a first substrate, and a first light emitting module is disposed on the first substrate;

the third display panel comprises a second substrate, a plurality of second light emitting modules are disposed on the second substrate, a color gamut adjustment module is disposed on at least one of the second light emitting modules, and the color gamut adjustment module is configured to adjust color gamuts of the second light emitting modules such that the color gamuts of the second light emitting modules are the same as a color gamut of the first light emitting module.

In a possible embodiment, the first light emitting module comprises a blue light emitting unit and a first fluorescence layer coated on the blue light emitting unit.

In a possible embodiment, the first fluorescence layer is a yellow fluorescence layer.

In a possible embodiment, each of the second light emitting modules comprises a blue light emitting unit, the color gamut adjustment module is disposed on each of the second light emitting modules.

In a possible embodiment, certain ones of the second light emitting modules comprise blue light emitting units, the color gamut adjustment module is disposed on the certain ones of the second light emitting modules.

In a possible embodiment, the first fluorescence layer comprises a red fluorescence layer and a green fluorescence layer.

In a possible embodiment, each of thicknesses of the yellow fluorescence layer, the red fluorescence layer, and the green fluorescence layer ranges from 100 to 200 microns.

In a possible embodiment, the thicknesses of the yellow fluorescence layer, the red fluorescence layer, and the green fluorescence layer are the same.

In a possible embodiment, the splicing screen further comprises a fourth display panel and a fifth display panel, the third display panel is a cross-shaped display panel, the first display panel, the second display panel, the fourth display panel, and the fifth display panel are connected to the third display panel to form the splicing screen.

In a second aspect, the embodiment of the present application provides a display device, the display device comprises any one of the above splicing screen.

The present application provides a splicing screen and a display device, and the display screen comprises at least a first display panel and a second display panel of a same type, and a third display panel with a type different from that of the first display panel and sandwiched between the first display panel and the second display pane. Each of the first display panel and the second display panel comprises the first light emitting module. The third display panel comprises a plurality of second light emitting modules. A color gamut adjustment module is disposed on at least one of the second light emitting modules such that a color gamut of the third light emitting module is the same as a color gamut of the first light emitting module to further make light emitted by the first display panel, the second display panel, and the third display panel similar, which prevents abnormal screen images from occurring at the splicing slits of the splicing screen and improves an entire display effect of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Figure 1:
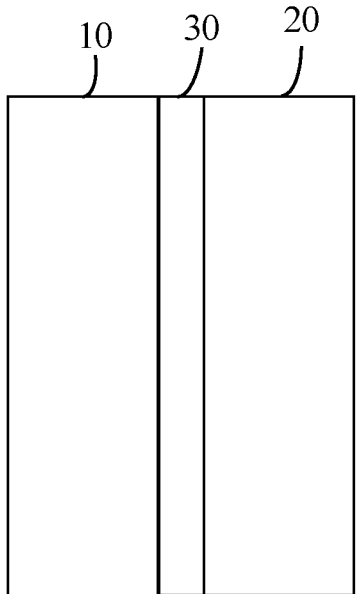
FIG. 1 is a schematic structural view of a splicing screen provided by an embodiment of the present application.

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

In the description of the present application, it should be understood that terminologies "center", "longitudinal", "transverse", "length", "width", "thickness", "upper", "lower", "front", "rear", "left", "side", "vertical", "horizontal", "top", "bottom", "inner", "outer", "clockwise", "counterclockwise" for indicating relations of orientation or position are based on orientation or position of the accompanying drawings, are only for the purposes of facilitating description of the present application and simplifying the description instead of indicating or implying that the referred device or element must have a specific orientation or position, must to be structured and operated with the specific orientation or position. Therefore, they should not be understood as limitations to the present application. Furthermore, terminologies "first", "second" are only for the purposes of description, and cannot be understood as indication or implication of comparative importance or a number of technical features. Therefore, a feature limited with "first", "second" can expressly or implicitly include one or more features. In the description of the present application, a meaning of "a plurality of" is two or more, unless there is a clear and specific limitation otherwise.

In the present application, the word "exemplary" is used to mean "serving as an example, illustration or description". Any embodiment described as "exemplary" in the present invention is not necessarily construed as preferred or more advantageous over other embodiments. In order to enable any person skilled in the art to implement and use the present invention, the following description is given. In the following description, details are set forth for the purpose of explanation. It should be understood that a person of ordinary skill in the art will appreciate that the present invention may be implemented without the use of these specific details. In other instances, the known structures and processes are not elaborated to avoid unnecessary details from making descriptions of the present invention becomes ambiguous. Therefore, the present invention is not intended to be limited to the illustrated embodiment, but is consistent with the broadest scope of the principles and features disclosed by the present invention.

It should be explained that a method of the embodiment of the present application is implemented in electronic apparatuses, and an object processed by each electronic apparatus is in form of data or message, for example, time, is substantially a time message. It can be understood that size, number, or location, once mentioned in later embodiments, are corresponding data such that the electronic apparatus can process the data, which is not described repeatedly here.

The embodiment of the present application provides a splicing screen and a display device that will be described in detail respectively as follows.

A general conventional splicing screen usually inserts a display panel of a smaller area between two larger display panels, and the display panel at a splicing slit also needs to display screen images normally. In general, micro light emitting diode display (MLED) is inserted between two liquid crystal display (LCD) panels, because a size of the MLED is highly variable and the MLED is frame-less and has a very high screen ratio. However, light emitting principles of the LCD and the MLED are different such that a color gamut of the MLED is far greater than a color gamut of the LCD, which leads to an issue of uneven screen images at connection portions of the display panel to affect display. The present application provides a splicing screen mainly lowers a color gamut of a MLED by adjusting a MLED structure such that the color gamut of the MLED is closed to the color gamut of the LCD to make optical effects of the MLED and the LCD consistent with each other to truly achieve a seamless large size splicing LCD.

With reference to FIG. 1, FIG. 1 is a schematic structural view of an embodiment of the embodiment of the present application provides a splicing screen. In an embodiment as shown in FIG. 1, the splicing screen comprises a first display panel 10, a second display panel 20, and a third display panel 30. The first display panel 10 and the second display panel 20 are same type display panels. The first display panel 10 and the third display panel 30 are different types. The third display panel 30 is sandwiched between the first display panel and the second display panel.

The first display panel 10 comprises a first substrate, and a first light emitting module is disposed on the first substrate. In an actual splicing screen, the first display panel 10 usually comprises a plurality of first light emitting modules, and structures of the first light emitting units are the same. In a specific embodiment, the first light emitting module comprises a blue light emitting unit, and a first fluorescence layer coated on the blue light emitting unit.

In a specific embodiment, the first fluorescence layer can be a yellow fluorescence layer such that blue light emitted by the blue light emitting unit excites the yellow fluorescence layer to emit white light to make the first light emitting unit able to emit white light.

Figure 2:
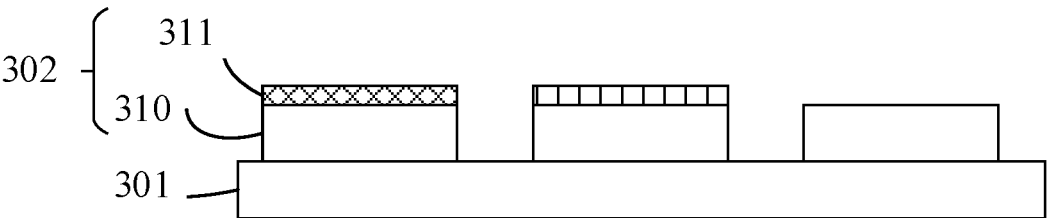
FIG. 2 is a schematic structural view of a third display panel provided by the embodiment of the present application.

With reference to FIG. 2, is schematic structural view of an embodiment of the third display panel provided by the embodiment of the present application. In FIG. 2, the third display panel comprises a second substrate 301 and a plurality of second light emitting modules 302 disposed on the second substrate 301. A color gamut adjustment module 311 is disposed on at least one of the second light emitting modules 302. The color gamut adjustment module 311 is mainly configured to adjust a color gamut of light emitted by the second light emitting modules 302 such that the color gamut of the light emitted by the second light emitting modules 302 is similar to a color gamut of light emitted by the first light emitting module to make the light emitted by the second light emitting modules 302 similar to the light emitted by the first light emitting module to adjust screen images of contact regions of the first display panel, the second display panel, and the third display panel.

In particular, with reference to FIG. 2, in FIG. 2, at least one of the second light emitting modules 302 comprises a blue light emitting unit 310, and a color gamut adjustment module 311 is also disposed on at least one of the blue light emitting units in the third display panel.

In an embodiment of the present application, each of the second light emitting modules 302 usually comprises a blue light emitting unit to emit blue light. With reference to FIG. 2, a plurality of blue light emitting units are disposed on the second substrate 301.

In the above embodiment, each of the second light emitting modules 302 comprises a blue light emitting unit, the color gamut adjustment modules 311 are disposed on the blue light emitting units 310 respectively. In another some embodiments, also certain ones of the second light emitting modules 302 can comprise blue light emitting units, and the color gamut adjustment module 311 are disposed on the certain second light emitting modules 302 comprising the blue light emitting units.

When only certain ones of the second light emitting modules 302 comprise the blue light emitting units 310, the certain second light emitting modules 302 comprising the blue light emitting units 310 can be disposed on the second substrate at interval, or can be disposed on a certain region of the second substrate centrally. Accordingly, when only certain ones of the second light emitting modules 302 comprise blue light emitting units, the color gamut adjustment modules 311 are disposed only on the certain second light emitting modules 302. Also, the color gamut adjustment module 311 can be disposed on certain ones of the blue light emitting units 310 at intervals, or be disposed on certain ones of the blue light emitting units 310 centrally.

Of course, it should be explained that no matter how the blue light emitting units 310 are disposed specifically, the color gamut adjustment module 311 disposed in the embodiment of the present application is always disposed on the blue light emitting units 310 and is disposed to correspond to the blue light emitting unit 310.

In an embodiment of the present application, the color gamut adjustment module can comprise a red fluorescence layer and a green fluorescence layer, and the red fluorescence layer and the green fluorescence layer are disposed on different ones of the blue light emitting units 310 instead of disposing the red fluorescence layer and the green fluorescence layer on the same blue light emitting unit 310 simultaneously.

With reference to FIG. 2, the embodiment as shown in FIG. 2 comprises a plurality of the blue light emitting units 310, the color gamut adjustment modules 311 are disposed on certain ones of the blue light emitting units, namely, a red fluorescence layer or a green fluorescence layer is coated on the blue light emitting units. At this time, the second light emitting module is changed to: three structures including a blue light emitting unit+a red fluorescence layer, a blue light emitting unit+a green fluorescence layer, and a single blue light emitting unit. The single blue light emitting unit emits blue light, the structure of the blue light emitting unit+the red fluorescence layer can utilize blue light to excite the red fluorescence layer to emit red light. Similarly, the structure of the blue light emitting unit+the green fluorescence layer can utilize blue light to excite the green fluorescence layer to emit green light. Red light, green light and blue light can also be obtained by using the above structure. Furthermore, color-mixing the red light, the green light, and the blue light can obtain white light such that the third display panel 30 can emit white light.

Also, because both the first display panel 10 and the third display panel 30 utilize blue light to excite the fluorescence layer to obtain white light, principles of light emission of the first display panel 10 and the third display panel 30 are similar. As such, spectrums of light emitted by the first display panel 10 and third display panel are close. On this basis, with optical debugging and algorithm, screen images of the first display panel 10 and the third display panel 30 can be adjusted to be consistent with each other to reduce the issue of abnormal screen images of splicing slits.

The embodiment shown in FIG. 2 only shows three second light emitting modules. Other embodiment can further comprise more second light emitting modules, and specific structures of the second light emitting modules can refer to the above contents and is not repeatedly described here.

The present application provides a splicing screen that comprises at least a first display panel and a second display panel of a same type, and a third display panel with a type different from that of the first display panel and sandwiched between the first display panel and the second display pane. Each of the first display panel and the second display panel comprises the first light emitting module. The third display panel comprises a plurality of second light emitting modules. A color gamut adjustment module is disposed on at least one of the second light emitting modules such that a color gamut of the third light emitting module is the same as a color gamut of the first light emitting module to further make light emitted by the first display panel, the second display panel, and the third display panel similar, which prevents abnormal screen images from occurring at the splicing slits of the splicing screen and improves an entire display effect of the display panel.

In an embodiment of the present application, a thickness of each of the yellow fluorescence layer, the red fluorescence layer, and the green fluorescence layer ranges from 100 to 200 microns. Also, usually the yellow fluorescence layer, the red fluorescence layer, and the green fluorescence layer are manufactured to have the same thickness.

However, in other embodiment, the thicknesses of the yellow fluorescence layer, the red fluorescence layer, and the green fluorescence layer can also be adjusted according to actual conditions to increase or reduce light intensity to further adjust screen images. Also, light emission intensity of each of the blue light emitting units can be adjusted to increase or decrease light intensity. Specific information can refer to the conventional technology and no limitation is here.

Figure 3:
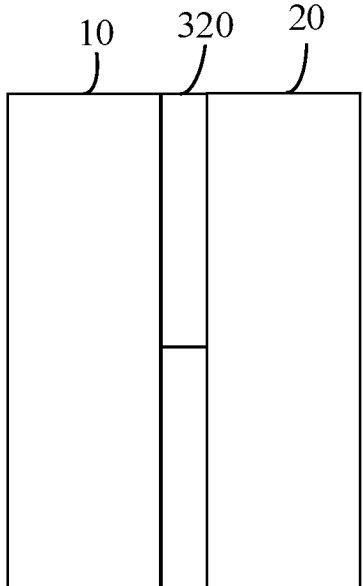
FIG. 3 is a schematic structural view of the splicing screen provided by the embodiment of the present application another embodiment.

For the splicing screen provided by the embodiment of the present application, it can comprise more display panels. In particular, With reference to FIG. 3, FIG. 3 is a schematic structural view of the splicing screen provided by the embodiment of the present application another embodiment. In FIG. 3, the third display panel can comprise a plurality of third sub-display panels 320, and the third sub-display panels 320 are same type display panels. The third sub-display panels 320 are sandwiched between the first display panel 10 and the second display panel 20.

In particular, third display panel can comprise two third sub-display panels 320 of the same type. With reference to FIG. 3, the two third sub-display panels 320 arranged in an array, and the two third sub-display panels 320 arranged in the array are also sandwiched between the first display panel 10 and the second display panel 20.

In other embodiment, the third display panel 30 can comprise three, four, or more third sub-display panels 320, and can also adopt the arrangement as shown in FIG. 3, which is not described repeatedly.

Figure 4:
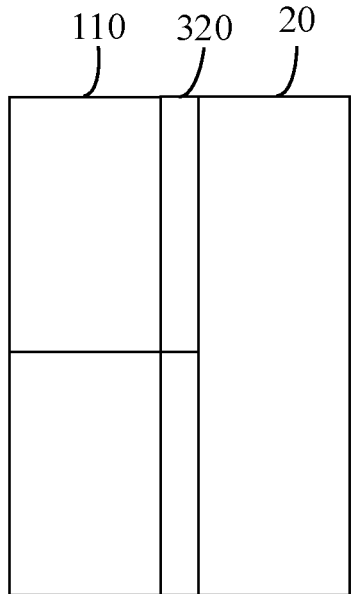
FIG. 4 is a schematic structural view of another embodiment of the splicing screen provided by the embodiment of the present application.

With reference to FIG. 4, FIG. 4 is a schematic structural view of another embodiment of the splicing screen provided by the embodiment of the present application. In FIG. 4, the first display panel 10 can comprise a plurality of first sub-display panels 110. The first sub-display panels 110 are same type display panels. The first sub-display panels 110 are disposed to correspond to the third sub-display panels 320 respectively. At this time, the third sub-display panels 320 are sandwiched between the first sub-display panels 110 and the second display panel 20.

Figure 5:
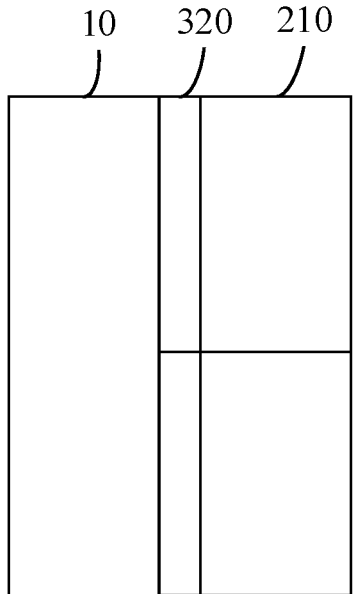
FIG. 5 is a schematic structural view of another embodiment of the splicing screen provided by the embodiment of the present application.

With reference to FIG. 5, FIG. 5 is a schematic structural view of another embodiment of the splicing screen provided by the embodiment of the present application. In FIG. 5, the second display panel 20 comprises a plurality of second sub-display panels 210. The second sub-display panels 210 are same type display panels. The second sub-display panels 210 are disposed to correspond to the third sub-display panels 320 respectively. At this time, the third sub-display panels 320 are sandwiched between the first display panel 10 and the second sub-display panels 210.

Figure 6:
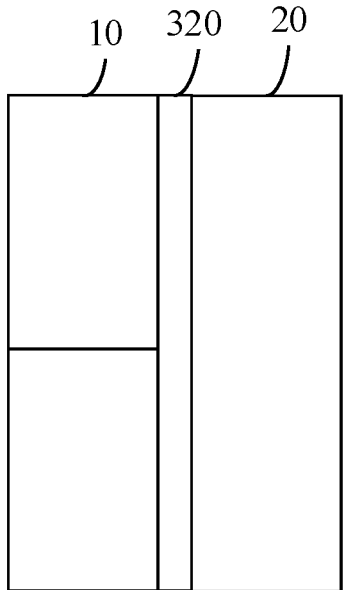
FIG. 6 is a schematic structural view of another embodiment of the splicing screen provided by the embodiment of the present application.

With reference to FIG. 6, FIG. 6 is a schematic structural view of another embodiment of the splicing screen provided by the embodiment of the present application. In FIG. 6, the first display panel 10 comprises a plurality of first sub-display panels 110. The first sub-display panels 110 are same type display panels. The first sub-display panels 110 are arranged in an array such that the third display panel 30 is sandwiched between the first sub-display panels 110 and the second display panel 20.

Figure 7:
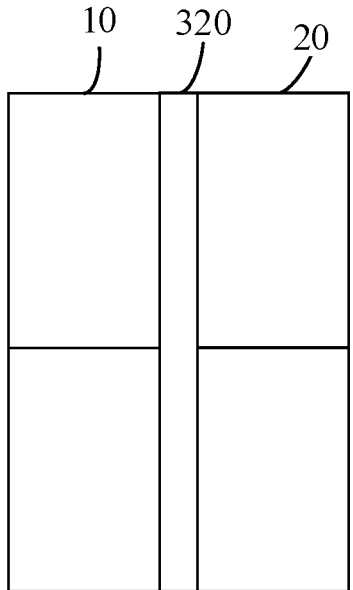
FIG. 7 is a schematic structural view of another embodiment of the splicing screen provided by the embodiment of the present application.

With reference to FIG. 7, FIG. 7 is a schematic structural view of another embodiment of the splicing screen provided by the embodiment of the present application. In FIG. 7, the second display panel 20 comprises second sub-display panels 210. The second sub-display panels 210 are same type display panels. The second sub-display panels 210 are arranged in an array such that the third display panel 30 is sandwiched between the first sub-display panels 110 and the second sub-display panels 210.

Figure 8:
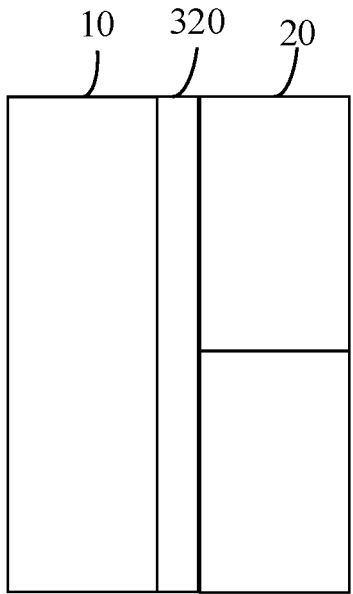
FIG. 8 is a schematic structural view of another embodiment of the splicing screen provided by the embodiment of the present application.

With reference to FIG. 8, FIG. 8 is a schematic structural view of another embodiment of the splicing screen provided by the embodiment of the present application. In FIG. 8, the second display panel 20 comprises the second sub-display panels 210. The second sub-display panels 210 are same type display panels. The second sub-display panels 210 are arranged in an array such that the third display panel 30 is sandwiched between the second sub-display panels 210 and the first sub-display panels 110.

Figure 9:
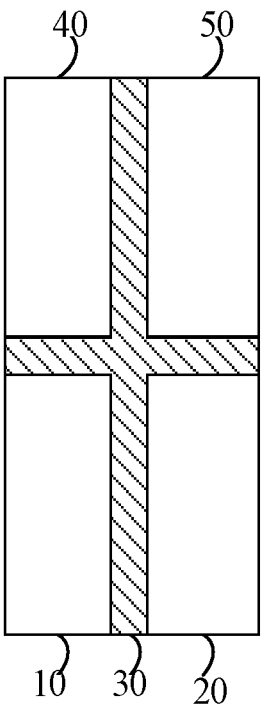
FIG. 9 is a schematic structural view of another embodiment of the splicing screen provided by the embodiment of the present application.

With reference to FIG. 9, FIG. 9 is a schematic structural view of another embodiment of the splicing screen provided by the embodiment of the present application. In FIG. 9, the splicing screen further comprises a fourth display panel 40 and a fifth display panel 50. At this time, the third display panel 30 is a cross-shaped display panel, and the first display panel 10, the second display panel 20, the fourth display panel, and the fifth display panel 50 are connected to the third display panel to form a splicing screen as shown in FIG. 9.

In general, in the above embodiment, the fourth display panel 40, the fifth display panel 50 and the first display panel 10 are same type display panels, and therefore can use the structures described by the above embodiment to mitigate an issue of poor screen image display effect of the splicing slit.

Figure 10:
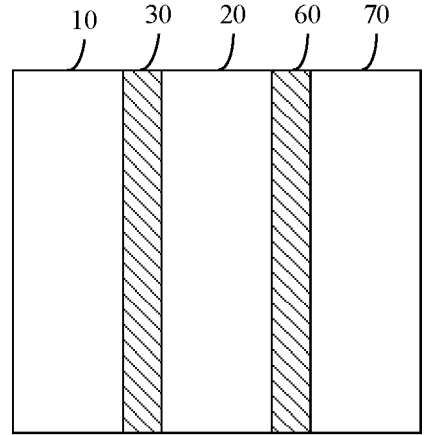
FIG. 10 is a schematic structural view of another embodiment of the splicing screen provided by the embodiment of the present application.
Figure 10:
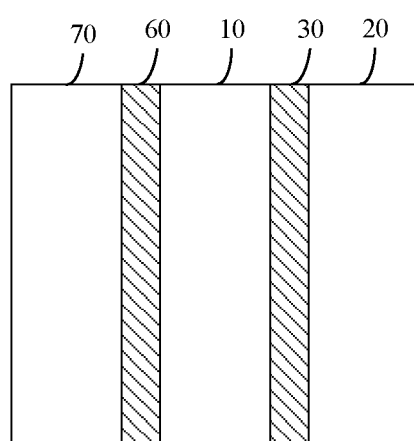

With reference to FIG. 10, FIG. 10 is a schematic structural view of another embodiment of the splicing screen provided by the embodiment of the present application. In FIG. 10, the splicing screen can further comprise a sixth display panel 60 and a seventh display panel 70. In the embodiment as shown in FIG. 10, the sixth display panel 60 is sandwiched between the second display panel 20 and the seventh display panel 70. Alternatively, the sixth display panel 60 is sandwiched between the first display panel 10 and the seventh display panel 70.

The embodiment of the present application further provides a display device, and the display device comprises any one of the above splicing screen. With reference to FIG. 1, FIG. 1 is a schematic structural view of an embodiment of the embodiment of the present application provides splicing screen. In an embodiment as shown in FIG. 1, the splicing screen comprises the first display panel 10, the second display panel 20, and the third display panel 30. The first display panel 10 and the second display panel 20 are same type display panels, and the first display panel 10 and the third display panel 30 are different types. The third display panel 30 is sandwiched between the first display panel and the second display panel.

The first display panel 10 comprises a first substrate, a first light emitting module is disposed on the first substrate. In an actual splicing screen, the first display panel 10 usually comprises a plurality of first light emitting modules, and structures of the first light emitting units are the same. In a specific embodiment, the first light emitting module comprises a blue light emitting unit, and a first fluorescence layer coated on blue light emitting unit.

In a specific embodiment, the first fluorescence layer can be a yellow fluorescence layer such that blue light emitted by the blue light emitting unit excites the yellow fluorescence layer to emit white light to make the first light emitting unit able to emit white light.

With reference to FIG. 2, is schematic structural view of an embodiment of the third display panel provided by the embodiment of the present application. In FIG. 2, the third display panel comprises a second substrate 301 and a plurality of second light emitting modules 302 disposed on the second substrate 301. A color gamut adjustment module 311 is disposed on at least one of the second light emitting modules 302. The color gamut adjustment module 311 is mainly configured to adjust a color gamut of light emitted by the second light emitting modules 302 such that the color gamut of the light emitted by the second light emitting modules 302 is similar to a color gamut of light emitted by the first light emitting module to make the light emitted by the second light emitting modules 302 similar to the light emitted by the first light emitting module to adjust screen images of contact regions of the first display panel, the second display panel, and the third display panel.

In particular, with reference to FIG. 2, in FIG. 2, at least one of the second light emitting modules 302 comprises a blue light emitting unit 310, and a color gamut adjustment module 311 is also disposed on at least one of the blue light emitting units in the third display panel.

In an embodiment of the present application, each of the second light emitting modules 302 usually comprises a blue light emitting unit to emit blue light. With reference to FIG. 2, a plurality of blue light emitting units are disposed on the second substrate 301.

In the above embodiment, each of the second light emitting modules 302 comprises a blue light emitting unit, the color gamut adjustment modules 311 are disposed on the blue light emitting units 310 respectively. In another some embodiments, also certain ones of the second light emitting modules 302 can comprise blue light emitting units, and the color gamut adjustment module 311 are disposed on the certain second light emitting modules 302 comprising the blue light emitting units.

When only certain ones of the second light emitting modules 302 comprise the blue light emitting units 310, the certain second light emitting modules 302 comprising the blue light emitting units 310 can be disposed on the second substrate at interval, or can be disposed on a certain region of the second substrate centrally. Accordingly, when only certain ones of the second light emitting modules 302 comprise blue light emitting units, the color gamut adjustment modules 311 are disposed only on the certain second light emitting modules 302. Also, the color gamut adjustment module 311 can be disposed on certain ones of the blue light emitting units 310 at intervals, or be disposed on certain ones of the blue light emitting units 310 centrally.

Of course, it should be explained that no matter how the blue light emitting units 310 are disposed specifically, the color gamut adjustment module 311 disposed in the embodiment of the present application is always disposed on the blue light emitting units 310 and is disposed to correspond to the blue light emitting unit 310. Furthermore, in an actual display panel, the blue light emitting unit can comprise a plurality of lamp beads able to emit light.

In an embodiment of the present application, the color gamut adjustment module can comprise a red fluorescence layer and a green fluorescence layer, and the red fluorescence layer and the green fluorescence layer are disposed on different ones of the blue light emitting units 310 instead of disposing the red fluorescence layer and the green fluorescence layer on the same blue light emitting unit 310 simultaneously.

With reference to FIG. 2, the embodiment as shown in FIG. 2 comprises a plurality of the blue light emitting units 310, the color gamut adjustment modules 311 are disposed on certain ones of the blue light emitting units, namely, a red fluorescence layer or a green fluorescence layer is coated on the blue light emitting units. At this time, the second light emitting module is changed to: three structures including a blue light emitting unit+a red fluorescence layer, a blue light emitting unit+a green fluorescence layer, and a single blue light emitting unit. The single blue light emitting unit emits blue light, the structure of the blue light emitting unit+the red fluorescence layer can utilize blue light to excite the red fluorescence layer to emit red light. Similarly, the structure of the blue light emitting unit +the green fluorescence layer can utilize blue light to excite the green fluorescence layer to emit green light. Red light, green light and blue light can also be obtained by using the above structure. Furthermore, color-mixing the red light, the green light, and the blue light can obtain white light such that the third display panel 30 can emit white light.

Also, because both the first display panel 10 and the third display panel 30 utilize blue light to excite the fluorescence layer to obtain white light, principles of light emission of the first display panel 10 and the third display panel 30 are similar. As such, spectrums of light emitted by the first display panel 10 and third display panel are close. On the this basis, with optical debugging and algorithm, screen images of the first display panel 10 and the third display panel 30 can be adjusted to be consistent with each other to reduce the issue of abnormal screen images of splicing slits.

The embodiment shown in FIG. 2 only shows three second light emitting modules. Other embodiment can further comprise more second light emitting modules, and specific structures of the second light emitting modules can refer to the above contents and is not repeatedly described here.

The present application provides a splicing screen that comprises at least a first display panel and a second display panel of a same type, and a third display panel with a type different from that of the first display panel and sandwiched between the first display panel and the second display pane. Each of the first display panel and the second display panel comprises the first light emitting module. The third display panel comprises a plurality of second light emitting modules. A color gamut adjustment module is disposed on at least one of the second light emitting modules such that a color gamut of the third light emitting module is the same as a color gamut of the first light emitting module to further make light emitted by the first display panel, the second display panel, and the third display panel similar, which prevents abnormal screen images from occurring at the splicing slits of the splicing screen and improves an entire display effect of the display panel.

In an embodiment of the present application, a thickness of each of the yellow fluorescence layer, the red fluorescence layer, and the green fluorescence layer ranges from 100 to 200 microns. Also, usually the yellow fluorescence layer, the red fluorescence layer, and the green fluorescence layer are manufactured to have the same thickness.

However, in other embodiment, the thicknesses of the yellow fluorescence layer, the red fluorescence layer, and the green fluorescence layer can also be adjusted according to actual conditions to increase or reduce light intensity to further adjust screen images. Also, light emission intensity of each of the blue light emitting units can be adjusted to increase or decrease light intensity. Specific information can refer to the conventional technology and no limitation is here.

For the splicing screen provided by the embodiment of the present application, it can comprise more display panels. In particular, With reference to FIG. 3, FIG. 3 is a schematic structural view of the splicing screen provided by the embodiment of the present application another embodiment. In FIG. 3, the third display panel can comprise a plurality of third sub-display panels 320, and the third sub-display panels 320 are same type display panels. The third sub-display panels 320 are sandwiched between the first display panel 10 and the second display panel 20.

In particular, third display panel can comprise two third sub-display panels 320 of the same type. With reference to FIG. 3, the two third sub-display panels 320 arranged in an array, and the two third sub-display panels 320 arranged in the array are also sandwiched between the first display panel 10 and the second display panel 20.

In other embodiment, the third display panel 30 can comprise three, four, or more third sub-display panels 320, and can also adopt the arrangement as shown in FIG. 3, which is not described repeatedly.

With reference to FIG. 4, FIG. 4 is a schematic structural view of another embodiment of the splicing screen provided by the embodiment of the present application. In FIG. 4, the first display panel 10 can comprise a plurality of first sub-display panels 110. The first sub-display panels 110 are same type display panels. The first sub-display panels 110 are disposed to correspond to the third sub-display panels 320 respectively. At this time, the third sub-display panels

320 are sandwiched between the first sub-display panels 110 and the second display panel 20.

With reference to FIG. 5, FIG. 5 is a schematic structural view of another embodiment of the splicing screen provided by the embodiment of the present application. In FIG. 5, the second display panel 20 comprises a plurality of second sub-display panels 210. The second sub-display panels 210 are same type display panels. The second sub-display panels 210 are disposed to correspond to the third sub-display panels 320 respectively. At this time, the third sub-display panels 320 are sandwiched between the first display panel 10 and the second sub-display panels 210.

With reference to FIG. 6, FIG. 6 is a schematic structural view of another embodiment of the splicing screen provided by the embodiment of the present application. In FIG. 6, the first display panel 10 comprises a plurality of first sub-display panels 110. The first sub-display panels 110 are same type display panels. The first sub-display panels 110 are arranged in an array such that the third display panel 30 is sandwiched between the first sub-display panels 110 and the second display panel 20.

With reference to FIG. 7, FIG. 7 is a schematic structural view of another embodiment of the splicing screen provided by the embodiment of the present application. In FIG. 7, the second display panel 20 comprises second sub-display panels 210. The second sub-display panels 210 are same type display panels. The second sub-display panels 210 are arranged in an array such that the third display panel 30 is sandwiched between the first sub-display panels 110 and the second sub-display panels 210.

With reference to FIG. 8, FIG. 8 is a schematic structural view of another embodiment of the splicing screen provided by the embodiment of the present application. In FIG. 8, the second display panel 20 comprises the second sub-display panels 210. The second sub-display panels 210 are same type display panels. The second sub-display panels 210 are arranged in an array such that the third display panel 30 is sandwiched between the second sub-display panels 210 and the first sub-display panels 110.

With reference to FIG. 9, FIG. 9 is a schematic structural view of another embodiment of the splicing screen provided by the embodiment of the present application. In FIG. 9, the splicing screen further comprises a fourth display panel 40 and a fifth display panel 50. At this time, the third display panel 30 is a cross-shaped display panel, and the first display panel 10, the second display panel 20, the fourth display panel, and the fifth display panel 50 are connected to the third display panel to form a splicing screen as shown in FIG. 9.

In general, in the above embodiment, the fourth display panel 40 the fifth display panel 50 and the first display panel 10 are same type display panels, and therefore can use the structures described by the above embodiment to mitigate an issue of poor screen image display effect of the splicing slit.

With reference to FIG. 10, FIG. 10 is a schematic structural view of another embodiment of the splicing screen provided by the embodiment of the present application. In FIG. 10, the splicing screen can further comprise a sixth display panel 60 and a seventh display panel 70. In the embodiment as shown in FIG. 10, the sixth display panel 60 is sandwiched between the second display panel 20 and the seventh display panel 70. Alternatively, the sixth display panel 60 is sandwiched between the first display panel 10 and the seventh display panel 70.

In the above-mentioned embodiments, the descriptions of the various embodiments are focused. For the details of the embodiments not described, reference may be made to the related descriptions of the other embodiments.

In specific implementation, each of the above units or structures may be implemented as a separate entity, or may be any combination, and implemented as the same entity or a plurality of entities. The specific implementation of the above units or structures refer to the previous method embodiment and will not be described repeatedly.

Specific embodying of each of the above operations can refer the above embodiments and is not repeatedly described here.

The splicing screen and the display device provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:

1. A splicing screen, wherein the splicing screen comprises a first display panel, a second display panel, and a third display panel, the first display panel and the second display panel are same type display panels, the first display panel and the third display panel are different types, the third display panel is sandwiched between the first display panel and the second display panel;

the first display panel comprises a first substrate, and a first light emitting module is disposed on the first substrate;

the third display panel comprises a second substrate, a plurality of second light emitting modules are disposed on the second substrate, a color gamut adjustment module is disposed on at least one of the second light emitting modules, and the color gamut adjustment module is configured to adjust color gamuts of the second light emitting modules such that the color gamuts of the second light emitting modules are the same as a color gamut of the first light emitting module;

wherein some of the second light emitting modules comprise blue light emitting units while the rest of the second light emitting modules do not comprise blue light emitting units, and the color gamut adjustment module is disposed on each of the second light emitting modules comprising the blue light emitting units.

2. The splicing screen according to claim 1, wherein the first light emitting module comprises a blue light emitting unit and a first fluorescence layer coated on the blue light emitting unit.

3. The splicing screen according to claim 2, wherein the first fluorescence layer is a yellow fluorescence layer.

4. The splicing screen according to claim 3, wherein the color gamut adjustment module comprises a red fluorescence layer and a green fluorescence layer.

5. The splicing screen according to claim 4, wherein each of thicknesses of the yellow fluorescence layer, the red fluorescence layer, and the green fluorescence layer ranges from 100 to 200 microns.

6. The splicing screen according to claim 5, wherein the thicknesses of the yellow fluorescence layer, the red fluorescence layer, and the green fluorescence layer are the same.

7. The splicing screen according to claim 1, wherein the splicing screen further comprises a fourth display panel and a fifth display panel, the third display panel is a cross-shaped display panel, the first display panel, the second display panel, the fourth display panel, and the fifth display panel are connected to the third display panel to form the splicing screen.

8. A display device, wherein the display device comprises any one of the splicing screen according to claim 1.

\* \* \* \* \*